(12) United States Patent
Schmidt et al.

(10) Patent No.: US 6,768,669 B2
(45) Date of Patent: Jul. 27, 2004

(54) VOLATILE MEMORY CELL RECONFIGURED AS A NON-VOLATILE MEMORY CELL

(75) Inventors: James T. Schmidt, Houston, TX (US); Joe F. Sexton, Houston, TX (US); Peter N. Ehlig, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/245,163

(22) Filed: Sep. 17, 2002

(65) Prior Publication Data

US 2004/0052103 A1 Mar. 18, 2004

(51) Int. Cl.$^7$ .............................................. G11C 11/40
(52) U.S. Cl. .............. 365/154; 365/185.07; 365/185.08
(58) Field of Search ............................. 365/154, 185.08, 365/156, 185.07

(56) References Cited

U.S. PATENT DOCUMENTS 4,271,487 A * 6/1981 Craycraft et al. ........... 365/184
4,575,819 A * 3/1986 Amin ......................... 365/104

* cited by examiner

*Primary Examiner*—Tan T. Nguyen
(74) *Attorney, Agent, or Firm*—Robert D. Marshall, Jr.; W. James Brady, III; Frederick J. Telecky, Jr.

(57) ABSTRACT

A conventional volatile SRAM cell is modified into a non-volatile, read only memory cell. This permits a device whose design currently includes on-chip SRAM, but no ROM, to have non-volatile, read only memory with minimal redesign and development effort. The modifications made to the already present SRAM are fairly minimal resulting in much of the modified SRAM being largely unchanged. Because existing on chip, volatile memory is used largely as is with fairly minimal modifications to make the memory non-volatile, the time-to-market for such a device is much shorter than it would have been had the device been redesigned to include conventional ROM.

12 Claims, 3 Drawing Sheets

VOLATILE MEMORY CELL RECONFIGURED AS A NON-VOLATILE MEMORY CELL

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to a memory cell. More particularly, the invention relates to a volatile memory cell reconfigured as a non-volatile memory cell. More particularly still, the invention relates to a volatile static random access memory ("SRAM") memory cell that has been configured to operate as non-volatile, read only memory cell.

2. Background of the Invention

Virtually all electronic equipment from calculators to computers to DVD players to electronics in an automobile include some type of memory storage. Storage can take the form of a drive such as a floppy drive, hard drive or CD ROM. Alternatively, storage may be implemented in the form of a solid state memory device. The present disclosure pertains to this latter class of storage technology.

Solid state memory itself can be implemented in a variety of forms. For purposes of understanding the memory improvements disclosed herein, solid state memory generally can be viewed in two forms—volatile and non-volatile. Volatile memory can store information as long as power is supplied to the device. Once power is removed from the device, the information stored therein is lost. Examples of volatile memory include static random access memory ("SRAM") and a dynamic RAM ("DRAM"), which are well known to those of ordinary skill in the art. By contrast, non-volatile memory retains its contents even when power is removed from the device. An example of a non-volatile memory device is a read only memory ("ROM") device, which also is well known to those of ordinary skill in the art.

A microprocessor is a semiconductor device that retrieves and executes instructions. The instructions may be referred to as "software" when the instructions are stored on a drive or "firmware" when the instructions are stored on a non-volatile memory device such as a ROM. In some situations, software and firmware are executed directly from their permanent storage location (i.e., drive, ROM). In other situations, this is not the case. Instead, software or firmware instruction are retrieved from their permanent storage location, copied to volatile RAM memory coupled to the processor device and executed therefrom. Thus, when it is desired to execute a particular application, the instructions comprising that application first are copied from their permanent storage location (e.g., a hard disk drive or ROM) to non-volatile memory (e.g., SRAM or DRAM). Then, the instructions are retrieved from the non-volatile memory into the microprocessor for processing and execution.

An exemplary application of this process is a digital signal processor ("DSP") that does not include ROM memory on the DSP chip itself. Such a device will have on-chip RAM, such as SRAM, for temporarily storing data and for storing instructions pending execution by the CPU core. The instructions are retrieved from an external ROM device over a bus interconnecting the ROM device to the DSP.

This configuration, namely, external ROM having firmware that is copied over a bus to a DSP device, generally works well. For various reasons, however, it is often desirable to have ROM memory implemented inside the DSP chip. For example, security of sensitive information contained in the firmware can be better protected if the firmware is stored permanently in ROM inside the DSP. Further, it is faster to copy firmware from ROM internal to the DSP to RAM internal to the DSP than from external ROM to RAM internal to the DSP. Thus, while in many systems firmware is permanently stored in ROM external to the DSP, it often is desirable for the firmware to be permanently stored in ROM internal to the DSP.

Of course, a DSP, that does not have on-chip ROM, can be redesigned to include such ROM in its design. Such a design effort, however, requires considerable time and money and thus the "time-to-market" for such a device may be significantly long. Accordingly, a solution to this problem is needed whereby a device (e.g., a DSP) can be implemented with non-volatile memory in a way that minimizes the time to market.

BRIEF SUMMARY OF THE INVENTION

The problems noted above are solved in large part by modifying a conventional volatile SRAM cell into a non-volatile, read only memory cell. This permits a device (e.g., a microprocessor or digital signal processor) whose design currently includes on-chip SRAM, but no ROM, to have non-volatile, read only memory with minimal redesign and development effort. The modifications made to the already present SRAM are fairly minimal resulting in much of the modified SRAM being largely unchanged. Because existing on chip, volatile memory is used largely as is with fairly minimal modifications to make the memory non-volatile, the time-to-market for such a device is much shorter than it would have been had the device been redesigned to include conventional ROM.

In accordance with one embodiment of the invention, a memory cell in which a bit can be stored comprises: a first transistor having a gate, a source and a drain; a second transistor having a gate, a source and a drain; a third transistor having a gate, a source and a drain; and a fourth transistor having a gate, a source and a drain, wherein the first, second, third and fourth transistors are coupled together. Further, the gates of the first and second transistors are connected together and to a power supply voltage and the gates of the third and fourth transistors are connected together and to a low signal.

In accordance with another embodiment, a memory cell in which a bit can be stored comprises: a first transistor having a gate, a source and a drain; a second transistor having a gate, a source and a drain; a third transistor having a gate, a source and a drain; and a fourth transistor having a gate, a source and a drain, wherein the first, second, third and fourth transistors are coupled together. Further, the gates of the first and second transistors are connected together and to a power supply voltage and the gates of the third and fourth transistors are connected together at a connection node and a means is included for providing a low signal level on the connection node. The power supply voltage in this embodiment can be a positive Vdd voltage or ground.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, semiconductor companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF THE PREFERRED EMBODIMENTS

Figure 1:
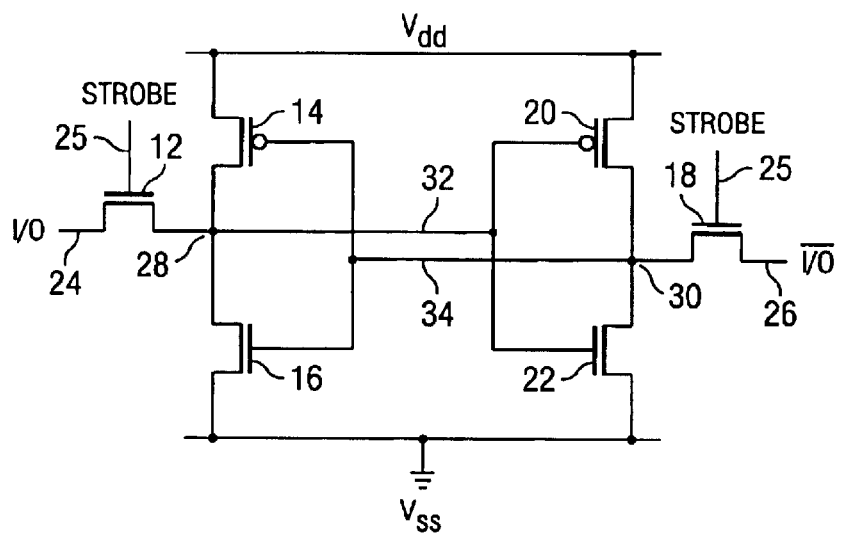
FIG. 1 shows a conventional, volatile SRAM memory cell.

Many microprocessor devices (such as DSPs) include on-chip, volatile SRAM memory as explained previously. As is well known, a DSP includes other components as well such as one or more DSP cores coupled to the SRAM. The problem observed above regarding how to implement, in a cost effective and rapid fashion, non-volatile memory in a device whose design does not currently include non-volatile, is solved as explained below. In the preferred solution, at least a portion of a processor's on-chip SRAM is modified to turn such memory into non-volatile, read only memory. This permits firmware and other types of information to be permanently stored in memory on the chip. Further, by modifying an existing memory cell already designed for the chip, the overall time to market for the device is minimized because much of the design for the existing memory need not be unchanged. There are additional benefits to the manufacturer such as increased yield and reduced test time, which are both cost reductions. From a customer perspective, there is reduced cost as an external ROM or Flash memory is not needed and thus not purchased, which also reduces system power consumption and system printed wiring board ("PCB") space consumption. FIG. 1 shows an existing implementation of a standard SRAM memory cell and FIGS. 2–5 show four preferred embodiments of how the standard SRAM cell of FIG. 1 can be modified to turn the cell into a non-volatile memory device.

Referring now to FIG. 1, a conventional SRAM memory cell comprises six transistors 12, 14, 16, 18, 20 and 22. Transistors 12, 16, 18 and 22 preferably are n-channel metal oxide semiconductor ("NMOS") devices and transistors 14 and 20 are p-channel metal oxide semiconductor ("PMOS") devices. Transistors 12 and 18 are used as both the input and the output of the memory cell. Input/output terminal 26 is at the opposite logic polarity of input/output terminal 24. The conventional SRAM cell shown in FIG. 1 thus accommodates the bit stored in the cell and its logical inverse. When reading the cell, the signals on both terminals 24 and 26 are provided to a differential sense amplifier (not shown). As is commonly known in the art, this permits a more robust design for differentiating between low and high signal levels.

In general, a bit is written to the SRAM cell by placing the desired bit level (i.e., logic 0 or logic 1) on input terminal 24 (and the opposite polarity on input 26). Then, signal line 25, which is a strobe used for write operations, is asserted thereby turning on transistors 12 and 18 and forcing nodes 28 and 30 to be at approximately the same voltage level as the associated inputs 24 and 26. The conventional SRAM memory cell shown in FIG. 1 includes two transistors 14 and 16 which retain the logic level of the bit written into the cell on terminal 24. Similarly, transistors 20 and 22 retain the logic level of the bit written into the cell on terminal 26. Both sets of transistors 14, 16 and 20, 22 are cross coupled via connections 32 and 34 as shown. These cross connections cause each pair of transistors (14, 16 and 20, 22) to keep the other set at the same logic levels. As such, when the strobe signals 25 are deasserted, the various transistors comprising the conventional SRAM cell continue to retain the same voltages caused by the input bit. If power (Vdd) is removed, however, the bit stored in the memory cell is lost.

Figure 2:
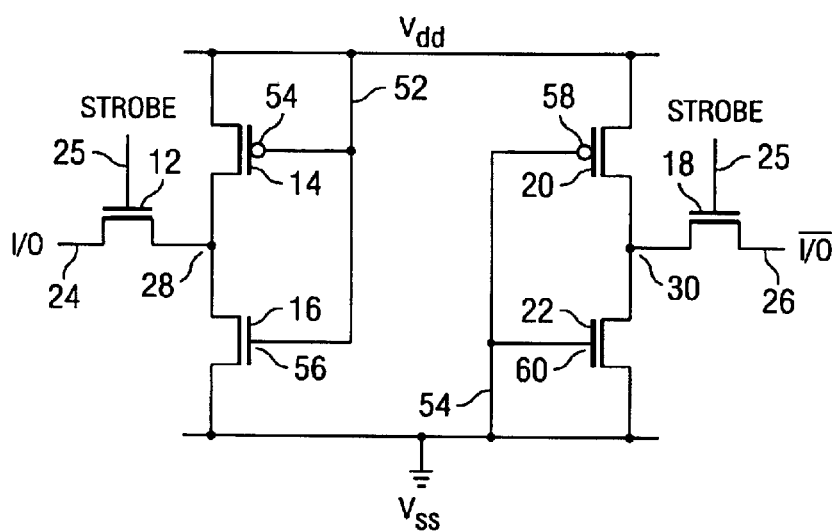
FIG. 2 shows a first preferred embodiment of the invention by which an SRAM memory cell is modified to be non-volatile and programmed to logic "0"

Referring now to FIG. 2, a first preferred embodiment of a non-volatile memory cell based on the conventional volatile SRAM cell is shown. As shown, the non-volatile memory cell generally comprises the same six transistors 12–22 as described previously with regard to the conventional SRAM cell of FIG. 1. Some of the connections in the circuit shown in FIG. 2 are the same as in FIG. 1, but other connections are different. The differences between the preferred embodiment of FIG. 2 and the SRAM cell of FIG. 1 include the elimination of the cross coupling connections 32 and 34 between the pairs of transistors 14, 16 and 20, 22 and the addition of connections 52 and 54. As shown, the gates 54 and 56 of transistors 14 and 16 connect together and connection 52 connects the gates to the power supply voltage, Vdd. The gates 58 and 60 of transistors 20 and 22 similarly are connected together and, via connection 54, are connected to ground, Vss.

As is commonly known, asserting the gate of an NMOS transistor to a logic high state causes the transistor to be in the "on" state which means current will be permitted to conduct from the transistor's drain to source terminals. Asserting the gate of a PMOS transistor to a logic high state causes the transistor to be "off" which precludes current from passing through the transistor from drain to source. Examining the left hand pair of transistors 14 and 16, with the gates 54 and 56 of the PMOS and NMOS transistors 14 and 16 pulled high by connection 52, transistor 14 will be in the off state and transistor 16 will be in the on state. This combination of states will cause node 28 to be pulled low. Thus, when the strobe line 25 is asserted, a logic 0 will be read from terminal 24. Moreover, connection 52 causes a logic 0 to be permanently programmed on node 28 and thus terminal 24.

Referring now to the right hand pair of transistors 20 and 22, with the gates 58 and 60 of the PMOS and NMOS transistors 20 and 22 pulled low by connection 54, transistor 20 will be in the on state and transistor 22 will be in the off state. This combination of states will cause node 30 to be pulled high. Thus, when the strobe line 25 is asserted, a logic 1 will be read from terminal 26. Moreover, connection 54 causes a logic 1 to be permanently programmed on node 30 and thus terminal 24.

Figure 3:
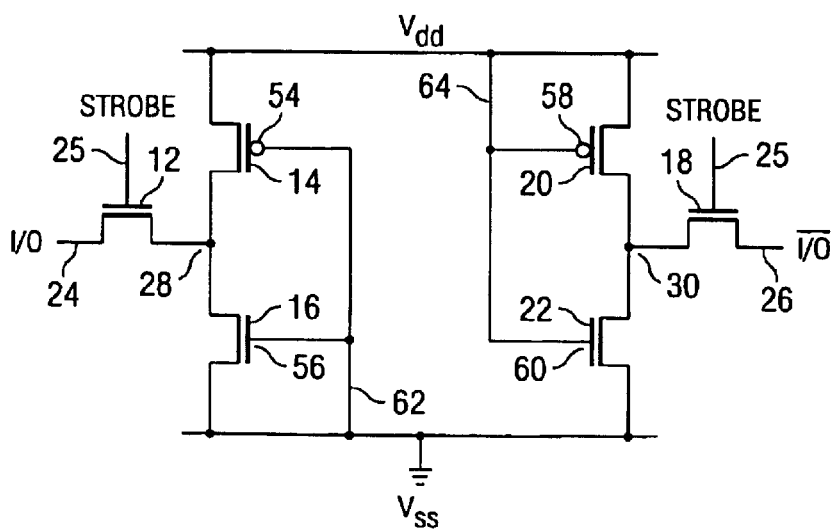
FIG. 3 shows a second preferred embodiment of invention turning a volatile SRAM memory cell into a non-volatile memory cell and programmed to logic "1"
Figure 4:
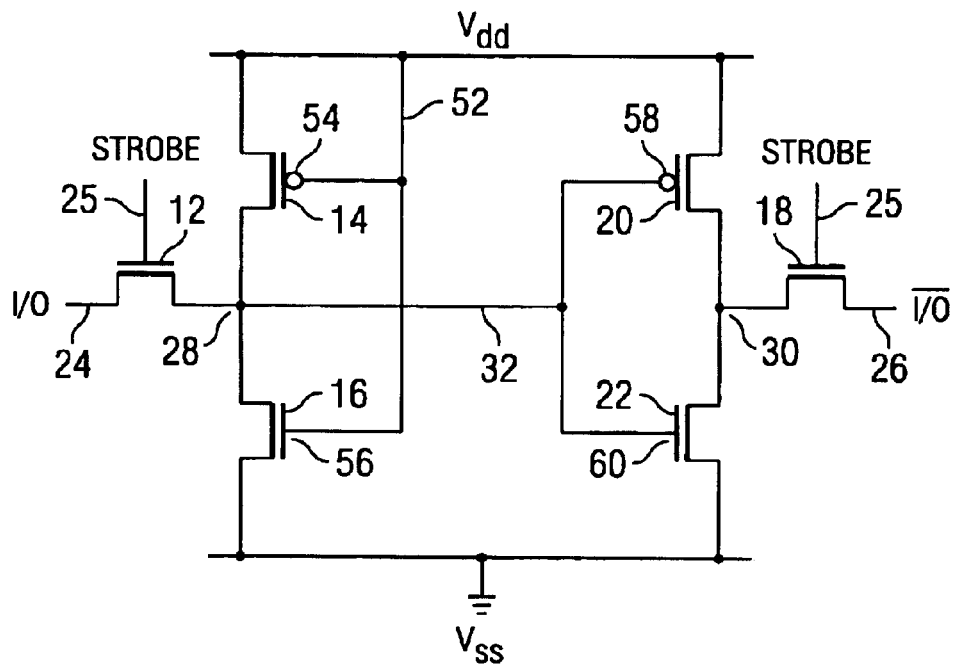
FIG. 4 shows a third preferred embodiment of invention turning a volatile SRAM memory cell into a non-volatile memory cell and programmed to logic "0"
Figure 5:
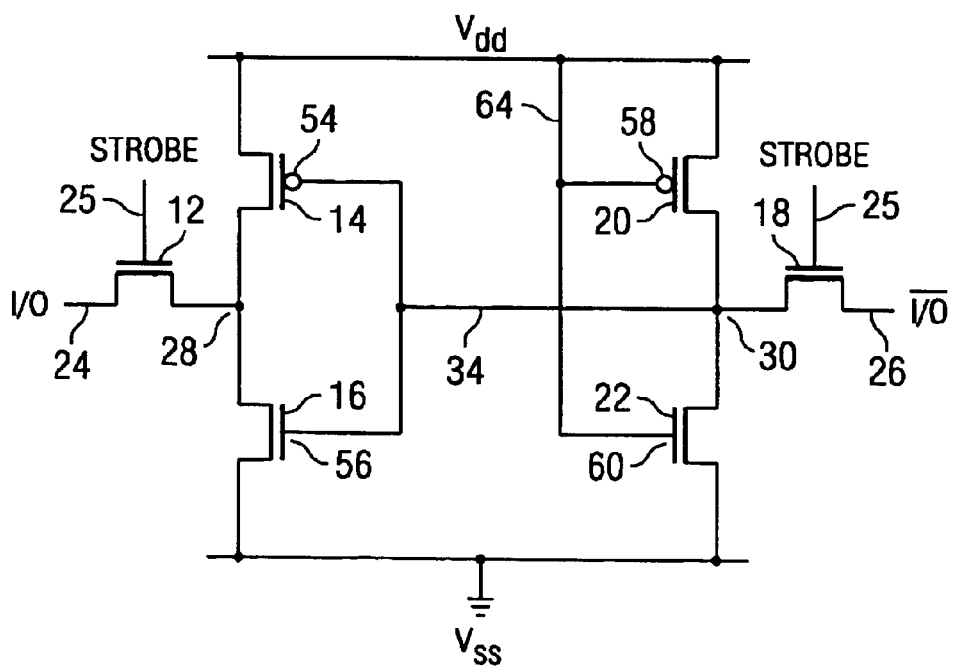
FIG. 5 shows a second preferred embodiment of invention turning a volatile SRAM memory cell into a non-volatile memory cell and programmed to logic "1"

In the embodiment of FIG. 2, connections 52 and 54 are included to program the cell for a logic 0 and have the cell retain that logic state even when power is removed and reapplied. As such, the SRAM cell of FIG. 1 has been transformed into a read only memory cell. The cell of FIG. 2, as well as the cells of FIGS. 3–5, is configured during the manufacturing process, in accordance with well known techniques. Using such techniques, firmware can be "burned" into the modified SRAM cells (now read only and non-volatile) during manufacturing.

FIG. 3 illustrates a similar embodiment to that of FIG. 2, but the cell is programmed for a logic 1. As shown in FIG. 3 in comparison to FIG. 2, connections 52 and 54 have been replaced by connections 62 and 64. Connection 62 pulls the gates 54, 56 of transistors 14 and 16 to a logic low state which forces transistor 14 on and transistor 16 off As a result, node 28 and thus terminal 24 are asserted to a logic high state. Connection 64 causes transistor 20 to be off and transistor 22 to be on thereby forcing node 30 and terminal 26 to a logic low state.

FIG. 4 shows a third preferred embodiment of the invention in which the cell is programmed for a logic 0. In this embodiment, connection 52 (discussed previously with regard to FIG. 2) is included as well as cross connection 32 between node 28 (which comprises the connection between the source of transistor 14 and drain of transistor 16) and the gates 58, 60 of transistors 20 and 22 (discussed previously with regard to FIG. 1). This embodiment is similar to that of FIG. 2 in that connection 52 pulls the gates 54, 56 of transistors 14 and 16 high forcing transistor 14 to the off state and transistor 16 to the on state. This action consequently forces node 28 low. In FIG. 2, the gates 58, 60 of transistors 20, 22 are pulled low by connection 54. In FIG. 4, the gates 58, 60 are pulled low by their connection to node 28, which as explained above is forced low. As such, terminal 24 will be asserted low and terminal 26 will be asserted high when strobe 25 is asserted.

FIG. 5 shows a fourth preferred embodiment of the invention in which the cell is programmed for a logic 1. In this embodiment, connection 64 (discussed previously with regard to FIG. 3) is included as well as cross connection 34 between node 30 and the gates 54, 56 of transistors 14 and 16. This embodiment is similar to that of FIG. 3 in that connection 64 pulls the gates 58, 60 of transistors 20 and 22 high forcing transistor 20 to the off state and transistor 22 to the on state. This action consequently forces node 30 low. In FIG. 3, the gates 54, 56 of transistors 14, 16 are pulled low by connection 62. In FIG. 5, the gates 54, 56 are pulled low by their connection to node 30, which as explained above is forced low. As such, terminal 24 will be asserted high and terminal 26 will be asserted low when strobe 25 is asserted.

Figure 6:
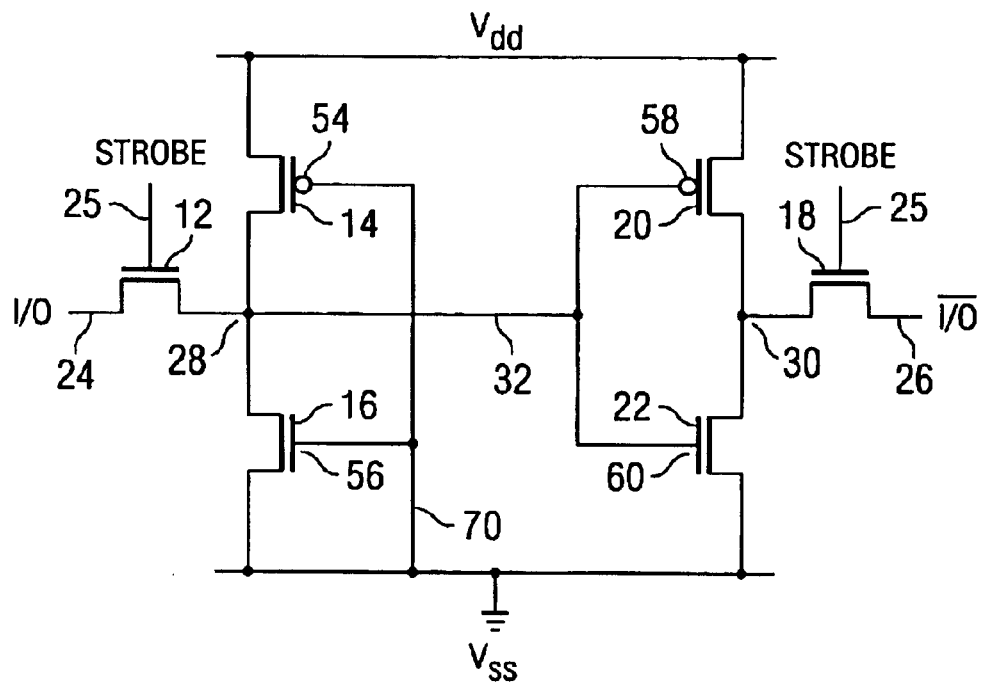
FIG. 6 shows an alternative to FIG. 4 in which the cell is programmed to a logic "1"
Figure 7:
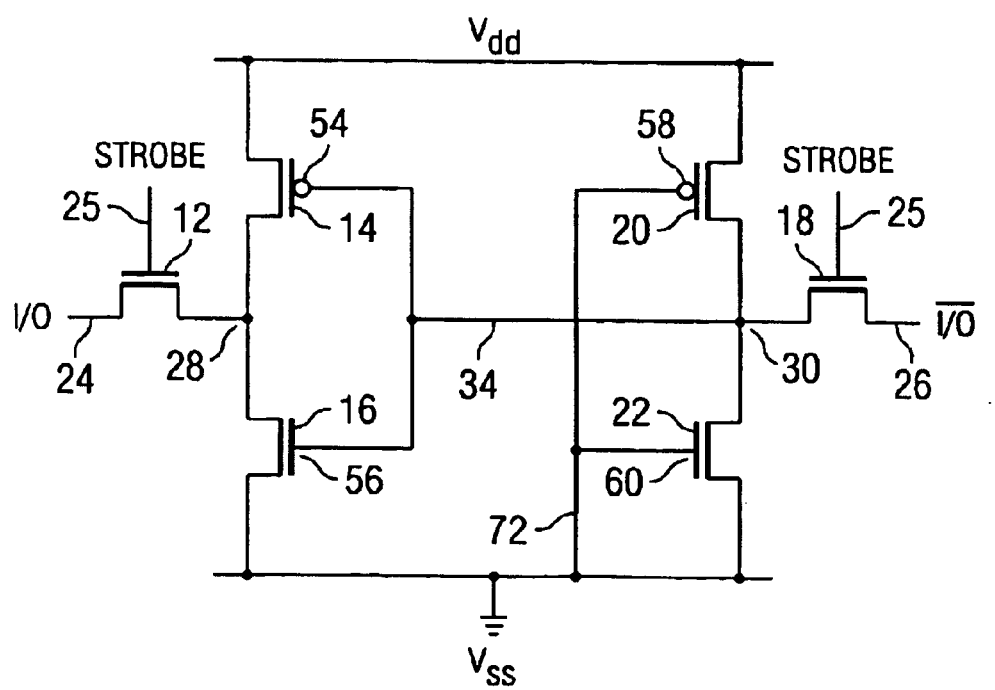
FIG. 7 shows an alternative to FIG. 5 in which the cell is programmed to a logic "0".

FIGS. 6 and 7 show alternative embodiments to the embodiments of FIGS. 4 and 5 to reverse the polarity of the bits. FIG. 6 is similar to FIG. 4 except that the gates 54 and 56 of transistors 14 and 16 are tied to ground via connection 70. This causes the cell to be programmed as a logic "1." Similarly, FIG. 7 tracks the architecture of FIG. 5 except that the gates of transistors 20 and 22 are pulled low via connection 72, thereby programming the cell as a logic "0."

The embodiments described above in FIGS. 2–5 provide various ways to transform a volatile SRAM cell into a non-volatile memory cell. Because, most of the components of the SRAM cell are left intact, relatively little effort and time are needed to develop and test non-volatile memory for a processor, or whatever device implements the invention. The preferred embodiments described herein are usable in conjunction with any type of semiconductor device that benefits from having on-chip read only memory. This scope of this disclosure, therefore, is not limited to just processors (e.g., DSPs), but extends to numerous other types of devices.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A memory cell in a non-volatile memory in which a bit can be stored, comprising:
   a first transistor having a gate, a source and a drain;
   a second transistor having a gate, a source and a drain;
   a third transistor having a gate, a source and a drain; and
   a fourth transistor having a gate, a source and a drain;
   said first, second, third and fourth transistors are coupled together;
   wherein the gates of the first and second transistors are connected together and to a power supply voltage and the gates of the third and fourth transistors are connected together and to a low signal; and
   a volatile random access memory coupled to the non-volatile memory.

2. The memory cell of claim 1 wherein said low signal level is a ground.

3. The memory cell of claim 1 wherein the source of the first transistor and the drain of the second transistor are connected together at a connection node and said low signal comprises the connection node.

4. The memory cell of claim 1 wherein the drain of the first transistor and the source of the second transistor are connected together at a connection node and said memory cell further includes an output terminal coupled to the connection node.

5. A processor, comprising:
   at least one core;
   volatile random access memory coupled to said at least one core;
   non-volatile memory coupled to said at least one core, said non-volatile memory comprising a plurality of memory cells, each cell including:
   a first transistor having a gate, a source and a drain;
   a second transistor having a gate, a source and a drain;
   a third transistor having a gate, a source and a drain; and
   a fourth transistor having a gate, a source and a drain;
   said first, second, third and fourth transistors are coupled together; and
   wherein the gates of the first and second transistors are connected together and to a power supply voltage and the gates of the third and fourth transistors are connected together and to a low signal.

6. The processor of claim 5 wherein said low signal level is a ground.

7. The processor of claim 5 wherein the source of the first transistor and the drain of the second transistor are connected together at a connection node and said low signal comprises the connection node.

8. The processor of claim 5 wherein the drain of the first transistor and the source of the second transistor are connected together at a connection node and said memory cell further includes an output terminal coupled to the connection node.

9. The processor of claim 5 wherein said processor comprises a digital signal processor.

10. A memory cell in a non-volatile memory in which a bit can be stored, comprising:

a first transistor having a gate, a source and a drain;

a second transistor having a gate, a source and a drain;

a third transistor having a gate, a source and a drain;

a fourth transistor having a gate, a source and a drain;

said fist, second, third and fourth transistors are coupled together;

wherein the gates of the first and second transistors are connected together and to a power supply voltage and the gates of the third and fourth transistors are connected together at a connection node;

a means for providing a low signal level on the connection node; and a volatile random access memory coupled to the non-volatile memory.

11. The memory cell of claim 10 wherein the power supply voltage is a voltage greater than 0 volts.

12. The memory cell of claim 10 wherein the power supply voltage is ground.

* * * * *